(12) United States Patent
Yang et al.

(10) Patent No.: US 6,214,745 B1
(45) Date of Patent: Apr. 10, 2001

(54) METHOD OF IMPROVING SURFACE PLANARITY OF CHEMICAL-MECHANICAL POLISHING OPERATION BY FORMING SHALLOW DUMMY PATTERN

(75) Inventors: Ming-Sheng Yang, Hsinchu; Yimin Huang, Taichung Hsien; Juan-Yuan Wu, Hsinchu; Water Lur, Taipei, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/195,685

(22) Filed: Nov. 19, 1998

(51) Int. Cl.⁷ .................................................. H01L 21/31
(52) U.S. Cl. ............................................ 438/759; 438/626
(58) Field of Search ..................................... 438/633, 634, 438/637, 645, 626, 631, 691, 692, 759

(56) References Cited

U.S. PATENT DOCUMENTS 6,001,733 * 12/1999 Huang et al. ........................ 438/633

* cited by examiner

Primary Examiner—David Nelms
Assistant Examiner—Quoc Hoang

(57) ABSTRACT

A chemical-mechanical polishing method utilizes a shallow dummy pattern for planarizing a dielectric layer. The method includes the steps of first forming a shallow dummy pattern on the dielectric layer, and then coating a patterned photoresist layer over the dielectric layer. Thereafter, the photoresist layer is used as a mask to form openings in other areas of the dielectric layer. Subsequently, the photoresist layer is removed to expose the shallow dummy pattern, and then a glue/barrier layer and a conductive layer are sequentially deposited. Next, a chemical-mechanical polishing operation is carried out to remove excess conductive layer and glue/barrier layer above the dielectric layer as well as the shallow dummy pattern at the same time. Since the removal rate of glue/barrier layer in each area above the dielectric layer is about the same, a planar substrate surface is obtained.

15 Claims, 7 Drawing Sheets

METHOD OF IMPROVING SURFACE PLANARITY OF CHEMICAL-MECHANICAL POLISHING OPERATION BY FORMING SHALLOW DUMMY PATTERN

BACKGROUND OF THE INVENTION

1. Field of Invention

The present invention relates to a chemical-mechanical polishing (CMP) method, and more particularly, to a CMP method that is capable of forming a highly planar surface by forming a dummy pattern.

2. Description of Related Art

As the level of integration of semiconductor devices increases, not enough area can be found on the surface of a silicon chip for forming all the necessary interconnects. To accommodate all interconnects resulting from a miniaturization of metal-oxide semiconductor (MOS) transistors, designs having two or more metallic layers are frequently employed. An inter-metal dielectric (IMD) layer is normally used as an isolating layer separating an upper and a lower metallic layer. The conductive line patterns of a metallic layer are normally buried within trenches, and connection between an upper and a lower conductive line pattern is achieved through a plug formed inside a via opening.

A conventional method of manufacturing interconnects includes the steps of forming a via opening in an inter-metal dielectric (IMD) layer, and then completely filling the via opening with a conductive material to form a plug. Thereafter, metallic lines are formed above the IMD layer. The metallic lines are formed by depositing a layer of metal over the IMD layer, and then performing conventional photolithographic and etching operations. However, when the metallic layer is etched, micro-bridges are frequently formed between neighboring metallic lines so that two metallic lines are linked, which leads to a short-circuiting condition.

To improve the situation of the micro-bridging effect, the metallic lines are formed by a damascene process. The method is to deposit a dielectric layer over the IMD layer after the plug is formed. The dielectric layer has a thickness roughly equal to the thickness of the subsequently formed metallic lines. Next, the dielectric layer is etched to form a trench pattern, and then metallic material is deposited into the trenches to form the metallic lines. Since there is no direct etching of the metallic layer, there is no micro-bridging effect.

Another method for eliminating the micro-bridging effect is known as a dual damascene process. Dual damascene process is very similar to a damascene process. The main difference is that a damascene process is carried out after the plug is formed. On the other hand, the via opening and the trench pattern in a dual damascene process are formed at the same time so that conductive material can be deposited in a single operation to form the interconnects.

For clarity of explanation, the trench pattern in a damascene process and the via opening plus the trench pattern in a dual damascene process will be referred to as "damascene pattern" from now on.

In both damascene and dual damascene process, the conductive material above the dielectric layer needs to be removed after the damascene pattern is completely filled. A chemical-mechanical polishing method can be used to remove the excess conductive material above the dielectric layer while obtaining a planar surface at the same time.

FIGS. 1A through 1E are cross-sectional views showing the progression of manufacturing steps in producing an interconnect that uses a chemical-mechanical polishing method to remove excess metal according to a conventional dual damascene process.

First, as shown in FIG. 1A, a conductive layer 12 is formed over a substrate 10. Thereafter, a dielectric layer 14 and an etching stop layer 16 are sequentially formed over the conductive layer 12. The dielectric layer 14 can be a silicon oxide ($SiO_x$) layer, and the etching stop layer 16 can be a silicon nitride ($SiN_x$) layer, for example. Then, a patterned photoresist layer 18 is formed over the etching stop layer 16. The patterned photoresist layer 18 is used for marking out the area for forming a via opening. Subsequently, the etching stop layer 16 is etched to form an opening using the photoresist layer 18 as a mask. The etching stop layer 16 is later used as a mask for patterning out the via opening.

Next, as shown in FIG. 1B, the photoresist layer 18 is removed, and then another dielectric layer 24 is formed over the etching stop layer 16.

Next, as shown in FIG. 1C, another patterned photoresist layer 28 is formed over the dielectric layer 24. The photoresist layer 28 is used to pattern out the trench region in the dielectric layer 24. In the subsequent step, a dry etching method, for example, is used to pattern the dielectric layer 24, thereby exposing the etching stop layer 16. Consequently, the dielectric layer 24 becomes a dielectric layer 24a having an opening pattern or trench 25 within. Thereafter, using the etching stop layer 16 as a mask, the dry etching operation is continued until a portion of the conductive layer 12 is exposed. Hence, the dielectric layer 14 becomes a dielectric layer 14a having a via opening 23 within.

Next, as shown in FIG. 1D, the photoresist layer 28 is removed, and then a glue/barrier layer 21 conformal to the surface profile of the substrate 10 is formed over the substrate 10. The glue/barrier layer 21 can be a tantalum nitride layer ($TaN_x$) for example. Subsequently, a metallic layer 22 is formed over the glue/barrier layer 21 completely filling the via opening 23 and the trench 25.

Next, as shown in FIG. 1E, a chemical-mechanical polishing operation is carried out to remove excess metallic material and glue/barrier layer 21 above the dielectric layer 24aHence, the metallic layer 22 becomes a metallic layer 22a and the glue/barrier layer 21 becomes a glue/barrier layer 21a.

However, there is a direct relationship between over-polishing time and polishing selectivity between the metallic layer 22 and the glue/barrier layer 21. When the polishing selectivity between the two layers is large, polishing time needs to be extended. In general, the metallic layer 22 has a higher polishing rate than the glue/barrier layer 21. Hence, when the glue/barrier layer 21 is exposed, the higher metallic content 22a of damascene pattern in the dense area 27 makes it easier to remove. Consequently, its neighboring glue/barrier layer 21 is also easier to remove. On the other hand, the damascene pattern in the open area 29 has a lower metallic content 22a, thereby making it difficult to remove.

In other words, the damascene pattern in the dense area 27 has a higher rate of removal than the damascene pattern in the open area 29. Consequently, time necessary for completely removing the glue/barrier layer 21 in the open area 29 will be greater than the time for removing the same glue/barrier layer 21 in the dense area 27. In order to remove completely the glue/barrier layer in the open area 29, areas such as the dense area 27 need to be over-polished. Therefore, an extra portion of the dielectric layer 24a in the dense area 27 will be polished away resulting in an eroded profile as shown in FIG. 1E.

One method of avoiding the erosion of dielectric layer 24a in the dense area 27 of a damascene pattern is to form a plurality of dummy patterns in the open area 29 of the damascene pattern. Consequently, the combined dummy pattern and open area 29 density is roughly equivalent to the density in the dense area 27. Hence, the rate of removal of glue/barrier layer is roughly the same in both the dense area 27 and the open area 29.

FIGS. 2A through 2C are cross-sectional views showing the steps in producing an interconnect using a chemical-mechanical polishing operation that has a higher polishing removal rate for a glue/barrier layer in the open area of a damascene pattern.

Since the steps leading to the structure as shown in FIG. 2A has already been described in FIGS. 1A and 1B, detailed description of previous manufacturing steps are omitted. First, as shown in FIG. 2A, a patterned photoresist layer 38 is formed over the dielectric layer 24. The patterned photoresist layer 38 exposes the trench areas and dummy pattern area of the dielectric layer 24. Next, a dry etching operation is carried out to etch the dielectric layer 24 using the photoresist layer 38 as a mask. Consequently, the etching stop layer 16 is exposed, and the dielectric layer 24 is turned into a dielectric layer 24b having openings that include trenches 25 and a dummy pattern 35.

Thereafter, using the exposed etching stop layer 16 as a mask, the dry etching operation is continued so that the dielectric layer 14 becomes a dielectric layer 14a having an opening or a via 23 within. Due to the presence of a dummy pattern 35 in the open area 29, the density of openings in the open area 29 is now similar to the density of openings in the dense area 27 of the dielectric layer 24b.

Next, as shown in FIG. 2B, the photoresist layer 38 is removed, and then a glue/barrier layer 31 conformal to the surface profile of the substrate 10 is formed over the substrate 10. The glue/barrier layer 31 can be a tantalum nitride layer ($TaN_x$), for example. Subsequently, a metallic layer 32 is formed over the glue/barrier layer 31 completely filling the via opening 23, the trenches 25, and the dummy pattern 35.

Next, as shown in FIG. 2C, a chemical-mechanical polishing operation is carried out to remove excess metallic material and glue/barrier layer 31 above the dielectric layer 24b. Hence, the filled via opening 23 (FIG. 2B) becomes a plug 32c, the filled trenches 25 (FIG. 2B) become conductive lines 32a, the filled dummy pattern 35 (FIG. 2B) forms dummy conductive lines 32b, and the glue/barrier layer 31 becomes glue/barrier layers 31a. In the presence of the dummy conductive lines 32b, density of conductive lines 32a in the dense area 27 is roughly the same as in the density of dummy conductive lines 32b in the open area 29. Consequently, polishing time can be shortened, and the problem of dielectric erosion in the dense area can be avoided. However, the dummy conductive lines 32b increase the intra-metal parasitic capacitance, thereby affecting the transmission speed of conductive lines.

In light of the foregoing, it is necessary to provide a method of planarizing a electric layer using a chemical-mechanical operation capable of attaining a higher level of planarity through the formation of a shallow dummy pattern.

SUMMARY OF THE INVENTION

Accordingly, the present invention provides a chemical-mechanical polishing method that utilizes a shallow dummy pattern for planarizing a dielectric layer. The method is capable of producing a surface with a high level of planarity and a shorter polishing time.

In another aspect, the invention provides a method of reducing the erosion of dielectric layer through the formation of a shallow dummy pattern.

In one further aspect, the invention provides a method of forming interconnects such that the shallow dummy pattern is removed as soon as the interconnects are formed to prevent intra-metal parasitic capacitance.

To achieve these and other advantages and in accordance with the purpose of the invention, as embodied and broadly described herein, the invention provides a chemical-mechanical polishing method that utilizes a shallow dummy pattern for planarizing a dielectric layer. The method includes the steps of first forming a shallow dummy pattern on the dielectric layer, and then coating a patterned photoresist layer over the dielectric layer. The photoresist layer covers the shallow dummy pattern. Thereafter, the photoresist layer is used as a mask to form openings in other areas of the dielectric layer. These openings expose a portion of the metallic layer underneath the dielectric layer. Subsequently, the photoresist layer is removed to expose the shallow dummy pattern, and then a glue/barrier layer and a conductive layer are sequentially deposited. Next, a chemical-mechanical polishing operation is carried out to remove excess conductive layer and glue/barrier layer above the dielectric layer as well as the shallow dummy pattern at the same time. Since the removal rate of glue/barrier layer in each area above the dielectric layer is about the same, a highly planar substrate surface is obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
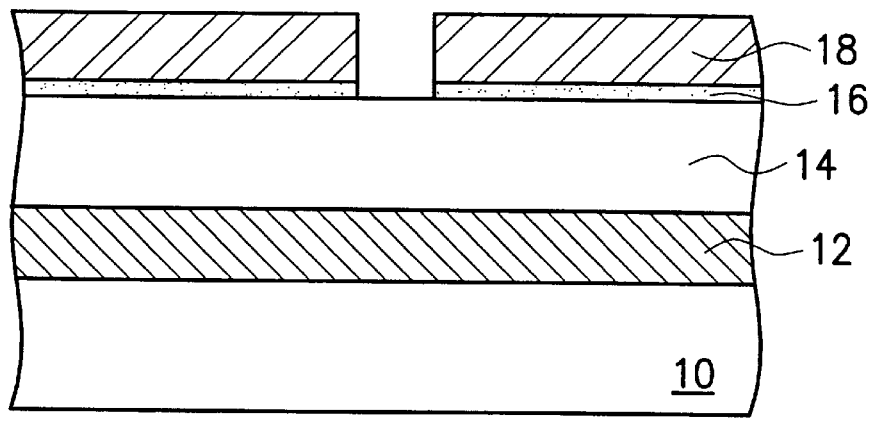
FIGS. 1A through 1E are cross-sectional views showing the progression of manufacturing steps taken in production of an interconnect that uses a chemical-mechanical polishing method to remove excess metal according to a conventional dual damascene process.
Figure 1B:
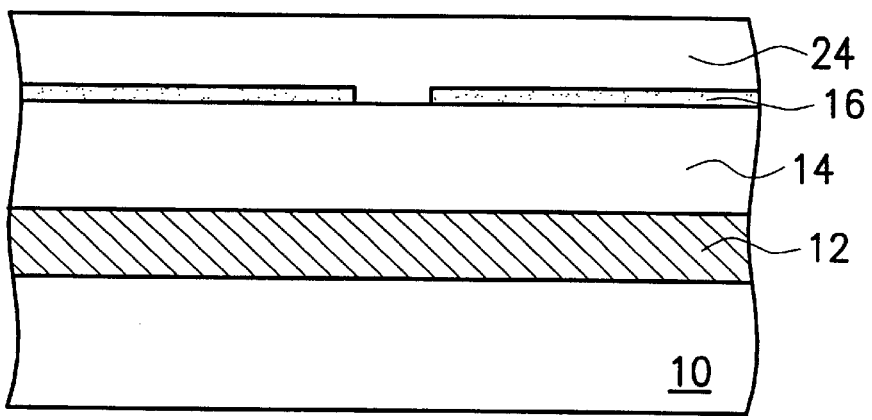
Figure 1C:
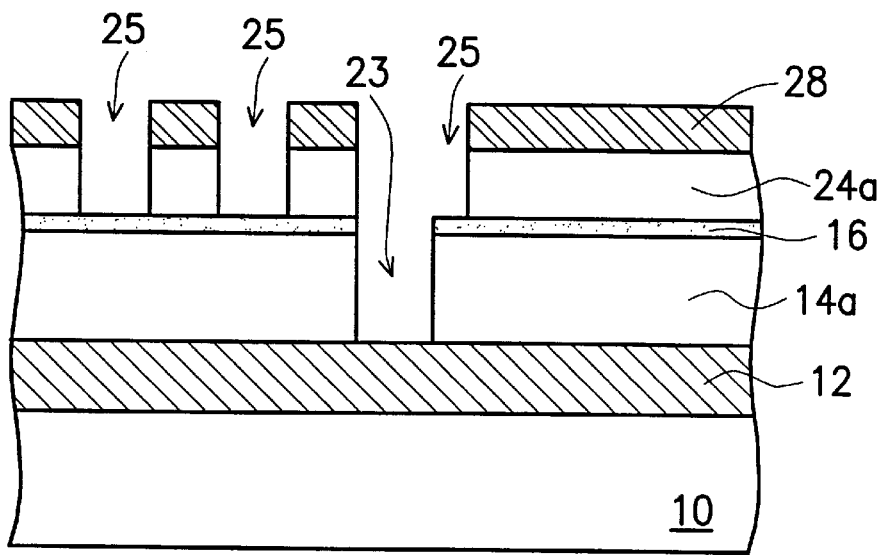
Figure 1D:
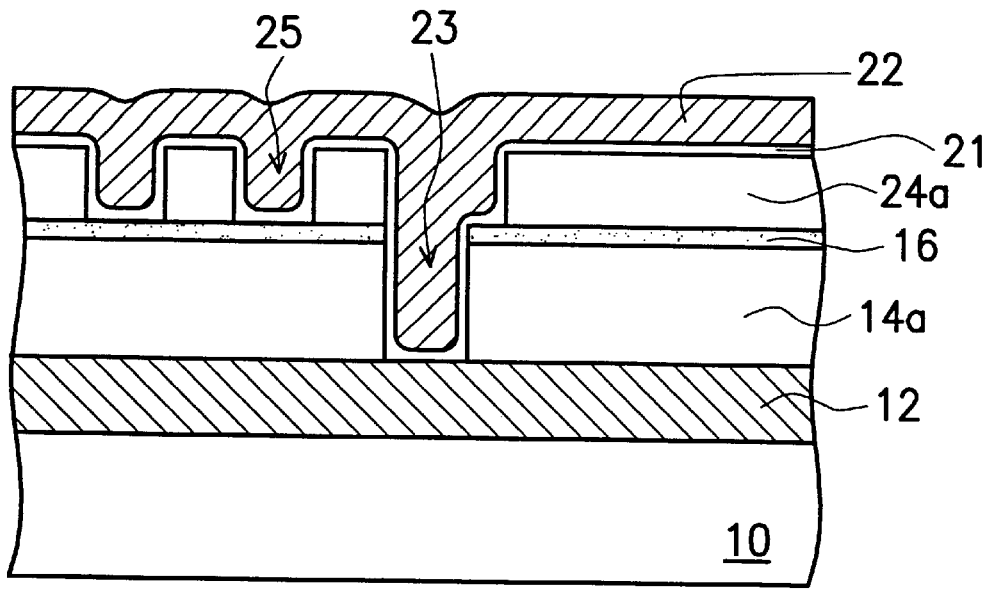
Figure 1E:
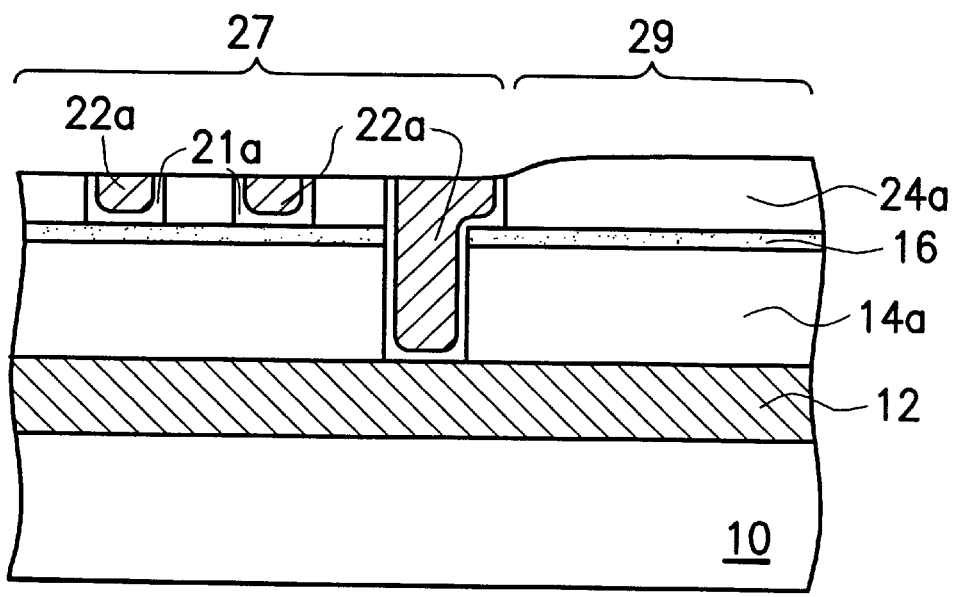

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3G are cross-sectional views showing the progression of manufacturing steps taken in production of an interconnect by using a shallow dummy pattern in a chemical-mechanical polishing operation according to one preferred embodiment of this invention.

Figure 3A:
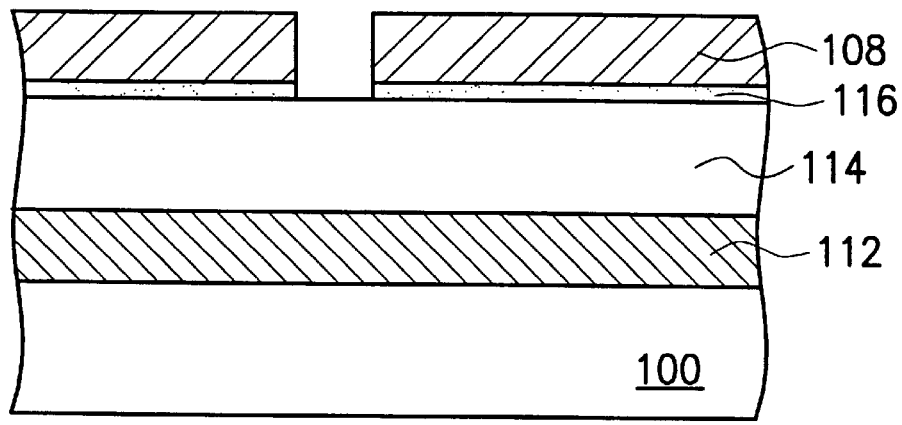
FIGS. 3A through 3G are cross-sectional views showing the progression of manufacturing steps taken in production of an interconnect by using a shallow dummy pattern in a chemical-mechanical polishing operation according to one preferred embodiment of this invention.

First, as shown in FIG. 3A, a conductive layer 112 is formed over a substrate 100. Thereafter, a dielectric layer 114 and an etching stop layer 116 are sequentially formed over the conductive layer 112. The dielectric layer 114 can be a silicon oxide ($SiO_x$) layer, and the etching stop layer 116 can be a silicon nitride ($SiN_x$) layer, for example. Then, a patterned photoresist layer 108 is formed over the etching stop layer 116. The patterned photoresist layer 108 is used for marking out the area where a via opening is formed. Subsequently, the etching stop layer 116 is etched to form an opening using the photoresist layer 108 as a mask. The etching stop layer 116 is later used as a mask in patterning out the via opening.

Figure 3B:
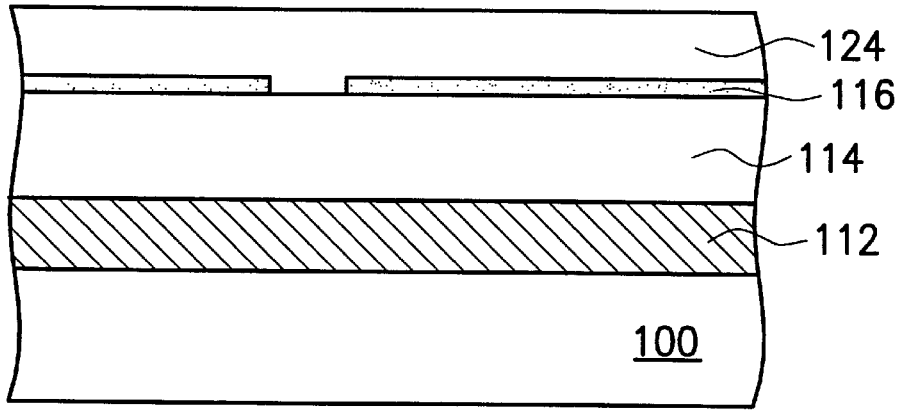

Next, as shown in FIG. 3B, the photoresist layer 108 is removed, and then another dielectric layer 124 is formed over the etching stop layer 116.

Figure 3C:
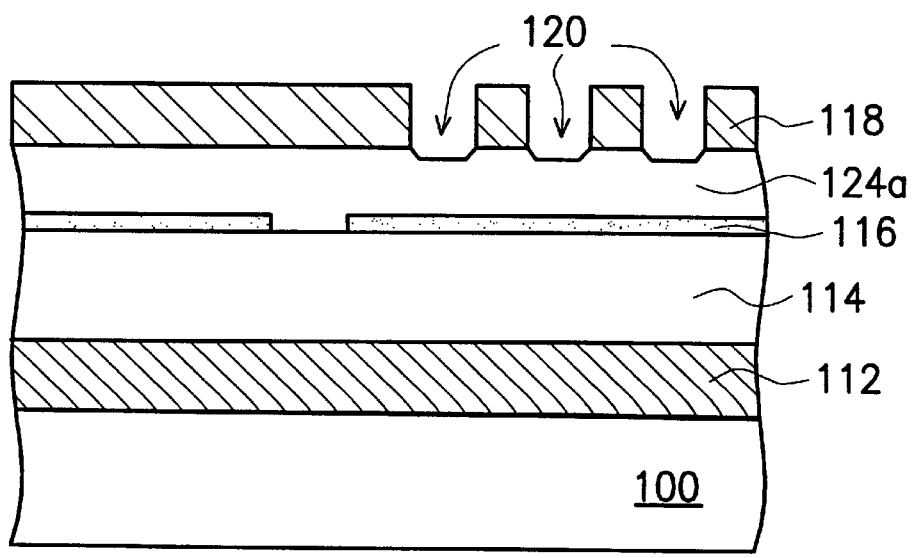

Next, as shown in FIG. 3C, another patterned photoresist layer 118 is formed over the dielectric layer 124. The patterned photoresist layer 118 is used for forming a dummy pattern on the open area 129 of the damascene pattern. Thereafter, using the photoresist layer 118 as a mask, a shallow dummy pattern 120 is formed above the dielectric layer 124 using a dry etching method. The shallow dummy pattern 120 is one major aspect in this invention. The dummy pattern 120 occupies only a small fraction of the thickness of the dielectric layer 124a. Preferably, the shallow dummy pattern 120 has a depth of 300–500 Å.

In designing the shallow dummy pattern, consideration must be made regarding the relationship between conductive line width versus the polishing rate of the dielectric layer and the removal time of the glue/barrier layer. In other words, line width of the dummy pattern in the open area 129 must be similar to the line width of the conductive lines in the dense area 127 of a damascene pattern.

Figure 4:
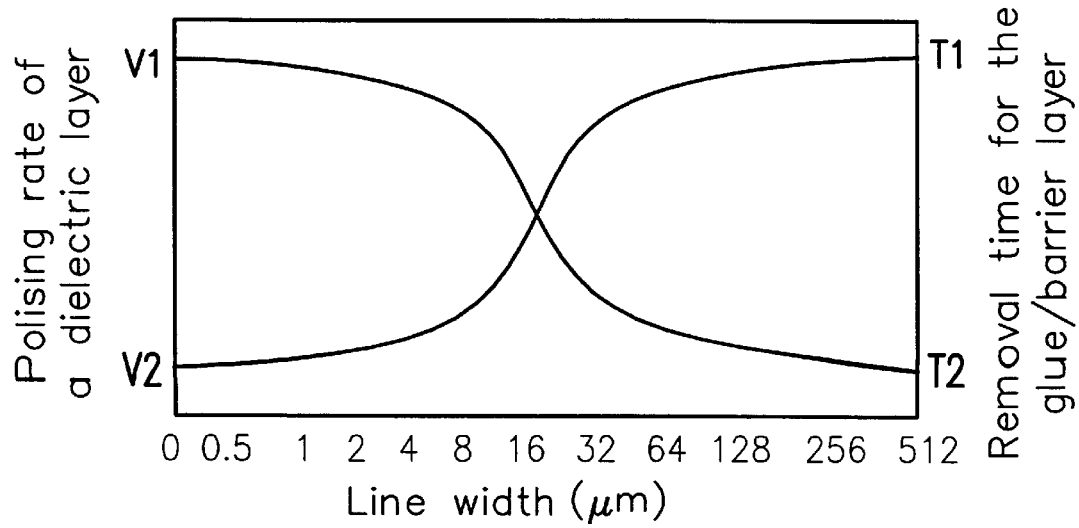
FIG. 4 is a graph showing the polishing rate of a dielectric layer and the corresponding time needed to remove a glue/barrier layer versus width of a conductive line for a pattern having a fixed density.

FIG. 4 is a graph showing the polishing rate of a dielectric layer and the corresponding time needed to remove a glue/barrier layer versus width of a conductive line for a pattern having a fixed density. In fact, FIG. 4 illustrates the relationship when the damascene pattern has a density fixed at 50%. In FIG. 4, the vertical axis represents respectively the polishing rate of a dielectric layer and the corresponding removal time for the glue/barrier layer. The horizontal axis represents line width. When the line width is small, for example, 0.5 μm, distance between neighboring conductive lines is also narrower, since the density of the damascene pattern is fixed.

Hence, the removal time for glue/barrier layer is a smaller value such as $T_2$, while the polishing rate of the dielectric layer is a faster value such as $V_1$. As line width of conductive lines increases, removal time of the glue/barrier layer is longer. For example, when the line width is about 5.2 μm, removal time of the glue/barrier layer is about $T_1$, but the corresponding polishing rate of the dielectric layer is lower, such as $V_2$.

For example, if the line width in the dense area 127 of a damascene pattern is about 0.5 μm the line width in the open area 129 of a damascene pattern is about 5.2 μm, line width of the dummy pattern in the open area 129 should be about 0.5 μu in order to reduce the removal time of the glue/barrier layer in the open area 129. In other words, the polishing time can be shortened from $T_1$ to $T_2$.

Figure 3D:
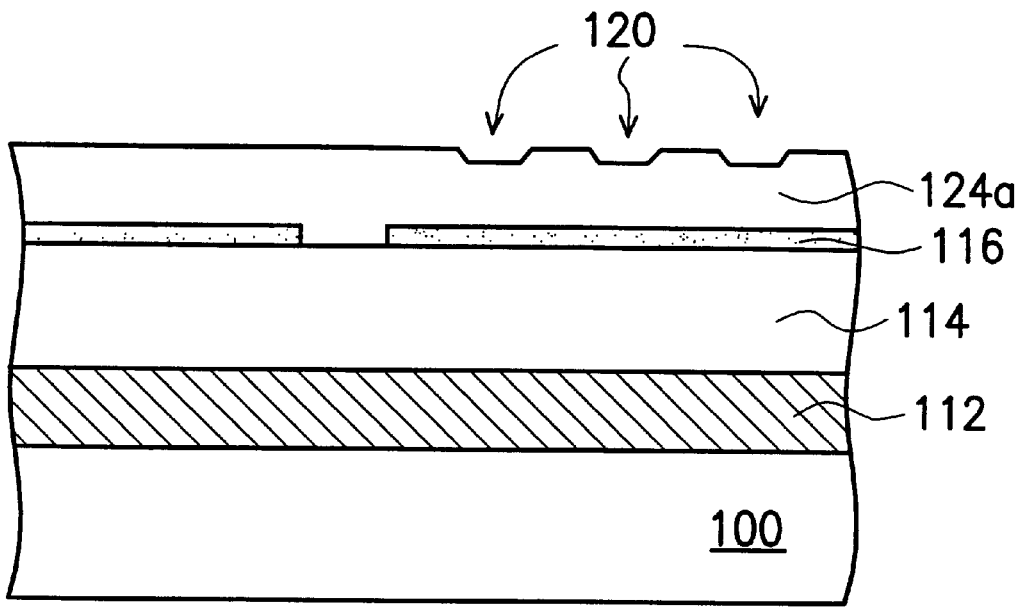

Next, as shown in FIG. 3D, the photoresist layer 118 is removed to expose the dielectric layer 124a, wherein the dielectric layer 124a has a shallow dummy pattern 120 on top.

Figure 3E:
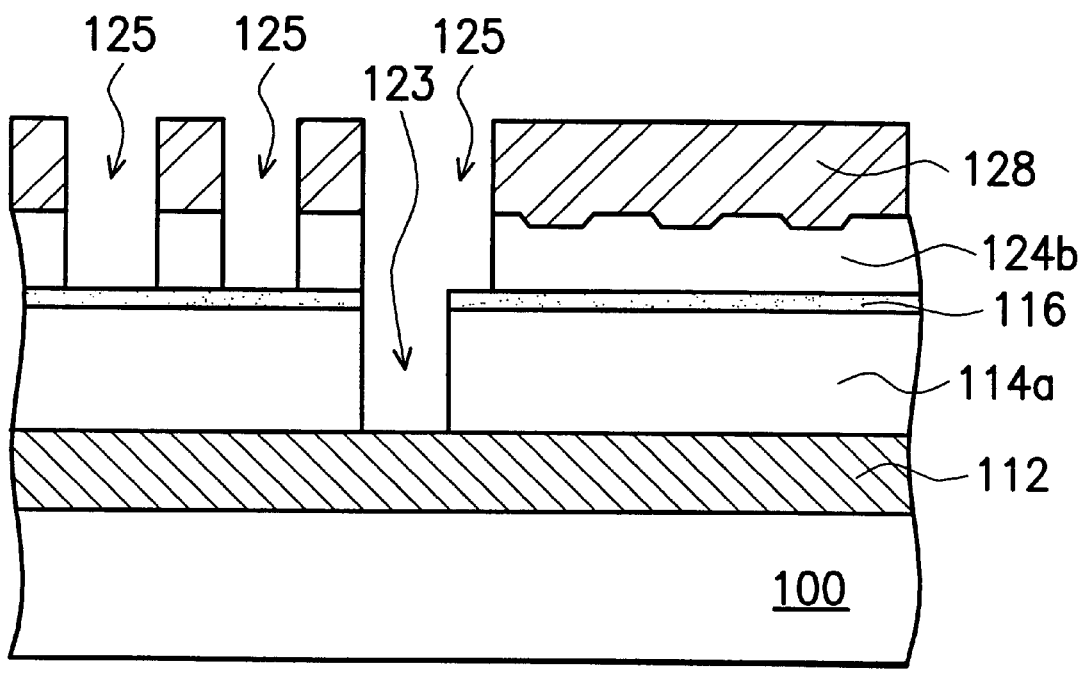

Next, as shown in FIG. 3E, a third patterned photoresist layer 128 is formed over the dielectric layer 124a. The patterned photoresist layer 128 is used for patterning out trench areas. Thereafter, using the photoresist layer 128 as a mask, a dry etching method is used to pattern the dielectric layer 124a. Consequently, a portion of the etching stop layer 116 is exposed and a dielectric layer 124b having a trench 125 within is formed. Subsequently, using the exposed etching stop layer 116 as a mask, dry etching of the dielectric layer 114 is carried out. Thus, a portion of the metallic layer 112 is exposed and a dielectric layer 114 having a via opening 123 within is formed. All through the dry etching operation, the shallow dummy pattern 120 is covered by the photoresist layer 128.

Figure 3F:
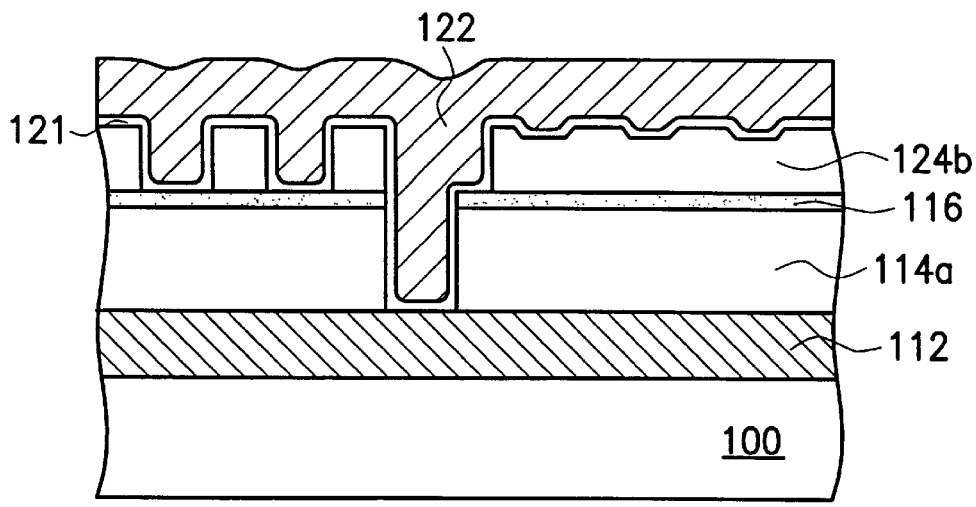

Next, as shown in FIG. 3F, the photoresist layer 128 is removed, and then a glue/barrier layer 121 conformal to the substrate profile is formed above the substrate structure 100. The glue/barrier layer 121, for example, can be a tantalum nitride tantalum nitride, tantalum, titanium and titanium nitride layer or other material with the same feature as known by someone skilled in the art. Thereafter, a metallic layer 122 is formed over the glue/barrier layer 121 that also completely fills the via opening 123 (FIG. 3E), the trench 125 (FIG. 3E) and the shallow dummy pattern 120 (FIG. 3D). The metallic layer 122, for example, can be a layer of copper.

Figure 3G:
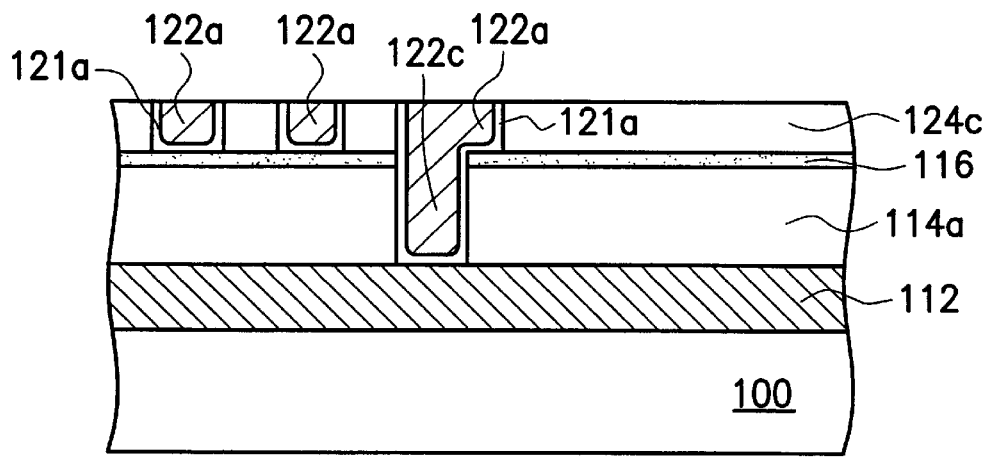

Next, as shown in FIG. 3G, a chemical-mechanical polishing operation is carried out to remove excess metallic layer 122 and glue/barrier layer 121 above the dielectric layer 124b. Hence, the filled via opening 123 (FIG. 3E) becomes a plug 122c, the filled trenches 125 (FIG. 3E) become conductive lines 122a, and the glue/barrier layer 121 becomes glue/barrier layers 121a. Note that the shallow dummy pattern 120 originally on top of the dielectric layer 124b have been completely removed so that the dielectric layer 124a now becomes a dielectric layer 124c. Due to the removal of shallow dummy pattern 120 from the substrate structure, no dummy conductive lines remain. Thus, the invention is capable of preventing the formation of intra-metal parasitic capacitance.

The polishing rate of metallic layer 122 is faster than the polishing rate of the glue/barrier layer 121 in the polishing operation after excess metallic layer 122 above the dielectric layer 124b is removed. This means that the metallic layer and a portion of the metallic layer within the trench 125 near the shallow dummy pattern 120 is easier to remove, and thus the glue/barrier layer 121 nearby is easier to remove, too. Consequently, polishing time can be effectively reduced. The polishing operation will stop only when all trace of the shallow dummy pattern is removed. Hence, a highly planar surface is ultimately obtained. Furthermore, besides shortening the polishing time, the method is also capable of preventing the erosion of dielectric layer in certain regions.

Figure 2A:
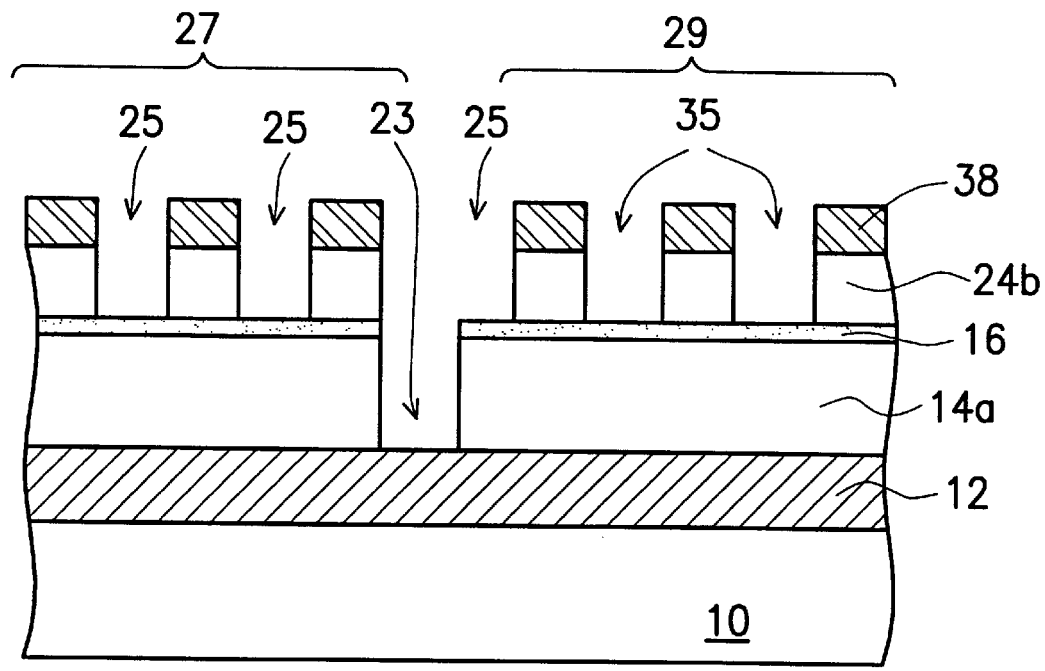
FIGS. 2A through 2C are cross-sectional views showing the steps taken in production of an interconnect using a chemical-mechanical polishing operation that has a higher polishing removal rate for the glue/barrier layer in the open area of a damascene pattern.
Figure 2B:
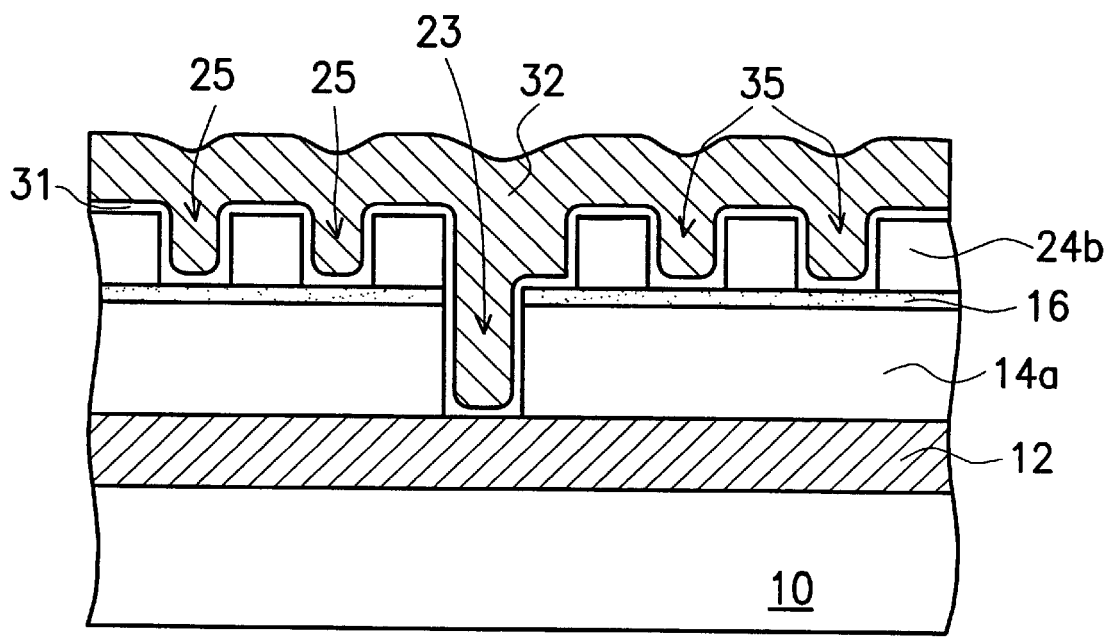
Figure 2C:
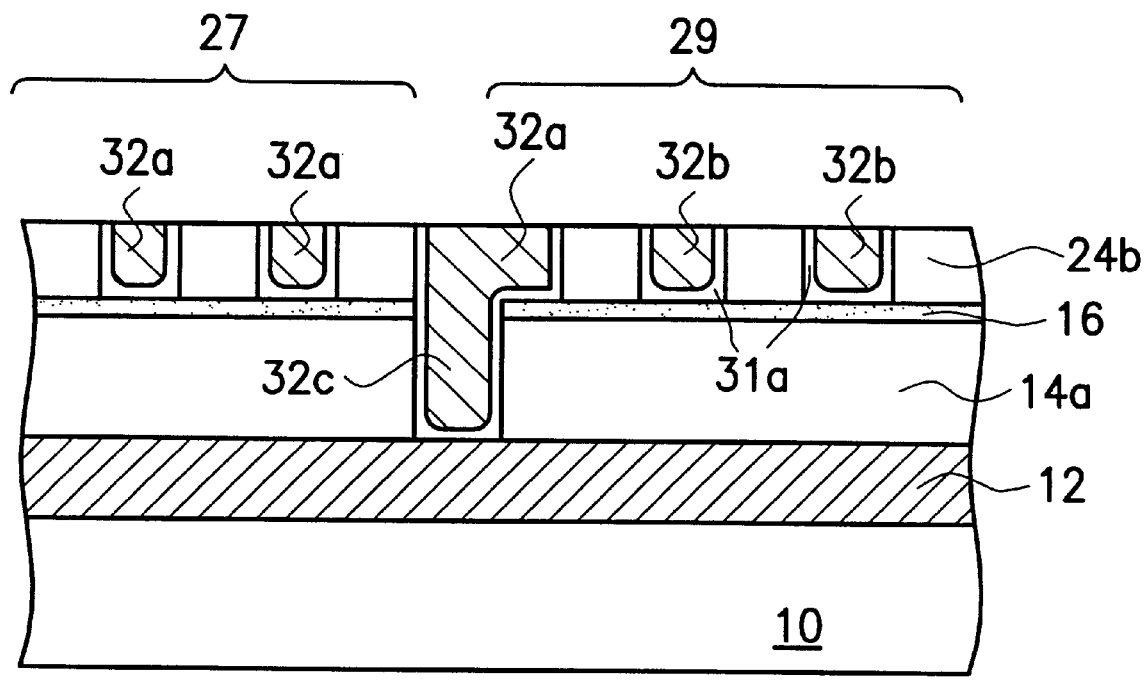

The shallow dummy pattern 120 of this invention works in a way similar to the dummy pattern 35, which is shown in FIG. 2A. Therefore, the dummy pattern 120 is capable of equating the polishing rate between the dense area 127 and the open area 129 of a damascene pattern in a chemical-mechanical polishing operation. However, a conventional dummy pattern 35 results in the formation of dummy conductive lines 32b as shown in FIG. 2C, whereas the shallow dummy pattern 120 of this invention disappears in the polishing process. Hence, there is no intra-metal parasitic capacitance problem.

In summary, major characteristics of this invention include:

1. The invention makes the polishing rate between the dense area and the open area of a damascene pattern roughly the same by establishing a shallow dummy pattern with a suitable line width in the open area.

2. By forming a shallow dummy pattern on top of a dielectric layer first and then using a chemical-mechanical polishing operation to polish the dielectric layer, polishing time can be shortened and a surface having a high degree of planarity can be obtained.

3. By forming a shallow dummy pattern over the dielectric layer, the dielectric layer erosion while the glue/barrier layer is polished can be prevented.

4. The shallow dummy pattern is completely removed as soon as the manufacturing of interconnects is complete. Hence, no dummy conductive lines are present, and no intra-metal parasitic capacitance is produced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of planarization, comprising the steps of:

forming a patterned metallic layer over a semiconductor substrate;

forming a dielectric layer over the patterned metallic layer;

etching the dielectric layer to form a plurality of shallow dummy patterns;

forming a mask layer on the etched dielectric layer such that the mask layer exposes a plurality of areas for forming openings while covering the shallow dummy patterns;

etching the dielectric layer again using the mask layer as a mask to form openings in the dielectric layer, wherein the openings expose a portion of the metallic layer;

removing the mask layer to expose the shallow dummy patterns;

forming a glue/barrier layer over the dielectric layer;

forming a conductive layer over the glue/barrier layer, wherein the conductive material completely fills the openings and the shallow dummy patterns; and performing a chemical-mechanical polishing operation to remove excess conductive layer and glue/barrier layer above the dielectric layer, and at the same time removing the shallow dummy patterned to obtain a planarized surface.

2. The method of claim 1, wherein the shallow dummy pattern has a depth of 300 Å–500 Å.

3. The method of claim 1, wherein the line width and the line density of the shallow dummy pattern are very similar to the line width in the areas having openings.

4. The method of claim 1, wherein the shallow dummy pattern is formed in a low pattern density areas for forming the openings.

5. The method of claim 1, wherein the step of forming the glue/barrier layer includes depositing a material selected from the group consisting of tantalum nitride, tantalum, titanium and titanium nitride.

6. The method of claim 1, wherein the step of forming the conductive layer includes depositing copper.

7. The method of claim 1, wherein the step of forming a mask layer includes depositing a photoresist material to form a photoresist layer.

8. The method of claim 1, wherein the polishing rate of the glue/barrier layer above the dielectric layer is the same in all places.

9. A method of planarization, comprising the steps of:

forming a patterned metallic layer over a semiconductor substrate;

forming a first dielectric layer over the patterned metallic layer;

forming an etching stop layer over the first dielectric layer that exposes areas for forming via openings;

forming a second dielectric layer that has a plurality of shallow dummy patterns over the etching stop layer;

forming a photoresist layer over the second dielectric layer such that the photoresist layer exposes areas for forming a plurality of trench patterns while covering the shallow dummy patterns;

etching the second dielectric layer using the photoresist layer as a mask until a portion of the etching stop layer is exposed, and then etching the first dielectric layer using the etching stop layer as a mask until a portion of the metallic layer is exposed, ultimately forming trench patterns within the second dielectric layer and forming via openings within the first dielectric layer;

removing the photoresist layer;

forming a glue/barrier layer over the exposed surface of the first dielectric layer and the second dielectric layer;

forming a conductive layer over the glue/barrier layer such that the conductive material completely fills the via openings, the trenches and the shallow dummy patterns; and performing a chemical-mechanical polishing operation to remove excess conductive layer and glue/barrier layer above the second dielectric layer, and at the same time removing the shallow dummy pattern to obtain a planarized surface.

10. The method of claim 9, wherein the shallow dummy pattern has a depth of 300 Å–500 Å.

11. The method of claim 9, wherein the shallow dummy pattern has line width very similar to the line width in the trench areas.

12. The method of claim 9, wherein the shallow dummy pattern is formed in the low opening density areas.

13. The method of claim 9, wherein the step of forming the glue/barrier layer includes depositing tantalum nitride.

14. The method of claim 9, wherein the step of forming the conductive layer includes depositing copper.

15. The method of claim 9, wherein the polishing rate of glue/barrier layer above the second dielectric layer is the same in all places.

* * * * *